US011659302B1

United States Patent
Tsai et al.

(10) Patent No.: US 11,659,302 B1
(45) Date of Patent: May 23, 2023

(54) DIFFERENTIAL SUBRANGE ADC FOR IMAGE SENSOR

(71) Applicant: OmniVision Technologies,Inc., Santa Clara, CA (US)

(72) Inventors: Chao-Fang Tsai, San Jose, CA (US); Zheng Yang, San Jose, CA (US); Chun-Hsiang Chang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 49 days.

(21) Appl. No.: 17/540,434

(22) Filed: Dec. 2, 2021

(51) Int. Cl.
*H04N 25/772* (2023.01)
*H03M 1/46* (2006.01)
*H03M 1/56* (2006.01)
*H04N 25/75* (2023.01)
*H03M 1/12* (2006.01)

(52) U.S. Cl.
CPC .......... *H04N 25/772* (2023.01); *H03M 1/462* (2013.01); *H03M 1/468* (2013.01); *H03M 1/56* (2013.01); *H04N 25/75* (2023.01)

(58) Field of Classification Search
CPC ..... H04N 25/75; H04N 25/772; H03M 1/462; H03M 1/468; H03M 1/56; H03M 1/1295
See application file for complete search history.

(56) References Cited

U.S. PATENT DOCUMENTS

| | | | | |
|---|---|---|---|---|
| 10,715,167 | B2* | 7/2020 | Lin | H03M 1/462 |
| 10,862,496 | B1* | 12/2020 | Neto | H03M 1/462 |
| 10,958,282 | B2* | 3/2021 | Olleman | H03M 1/462 |
| 11,296,710 | B2* | 4/2022 | Roodnat | H03L 7/093 |
| 2011/0057823 | A1* | 3/2011 | Harpe | H03M 1/125 341/133 |
| 2015/0008308 | A1* | 1/2015 | Huang | H03M 1/14 250/208.1 |
| 2016/0360138 | A1* | 12/2016 | Meunants | H04N 25/772 |
| 2021/0105422 | A1* | 4/2021 | Tsai | H03M 1/462 |

OTHER PUBLICATIONS

IEEE Journal of Solid State Circuits, vol. 45, No. 4, Apr. 2010; A 10-bit 50-MS/s SAR ADC With a Monotonic Capacitor Switching Procedures; Chun-Cheng Liu, et. al.
IEEE Transactions On Circuits and Systems-1: Regular Papers, vol. 60, No. 3, Mar. 2013; A 9-Bit 150-MS/S Subrange ADC Based on SAR Architecture in 90-nm CMOS; Ying-Zu Lin, et. al.

* cited by examiner

*Primary Examiner* — Marly S Camargo

(57) ABSTRACT

A differential subrange analog-to-digital converter (ADC) converts differential analog image signals received from sample and hold circuits to a digital signal through an ADC comparator. The comparator of the differential subrange ADC is shared by a successive approximation register (SAR) ADC coupled to provide both M upper output bits (UOB) and a ramp ADC coupled to provide N lower output bits (LOB). Digital-to-analog converters (DACs) of the differential subrange SAR ADC comprises 2M buffered bit capacitor fingers connected to the comparator. Each buffered bit capacitor finger comprises a bit capacitor, a bit buffer, and a bit switch controlled by the UOB. Both DACs are initialized to preset values and finalized based on the values of the least significant bit of the UOB. The subsequent ramp ADC operation will be ensured to have its first ramp signal ramps in a monotonic direction and its second ramp signal ramp in an opposite direction.

29 Claims, 6 Drawing Sheets

DIFFERENTIAL SUBRANGE ADC FOR IMAGE SENSOR

TECHNICAL FIELD

This disclosure relates generally to image sensors, and in particular but not exclusively, relates to analog to digital conversion (ADC) circuitry for use in reading out image data from an image sensor.

BACKGROUND INFORMATION

Image sensors have become ubiquitous. They are widely used in digital still cameras, cellular phones, security cameras, as well as, medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important. To achieve higher quality, the increase of the number of pixels within the array provides one solution. To eliminate as much noise in the image data as possible provides the other. A common way in CMOS image sensors to reduce noise is correlated double sampling (CDS). CDS reduces the noise in the signal by calculating the difference between the signal voltage value (image grey value), and a reset signal (image black background noise, also called dark current noise) for the given pixel. Implementing CDS reduces the fixed pattern noise and other temporal noise from the image data. Correlated double sampling may be done in analog or digital domain.

A system for digital correlated double sampling for an image sensor having a plurality of pixels includes: an analog-to-digital convertor (ADC) stage for converting analog data into digital image data and outputting reset data; memory for storing both the digital image data and the reset data; and an analog or a digital correlated double sampling (CDS) stage for generating correlated double sampled image data based upon the subtraction between the digital image data and the digital reset data.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
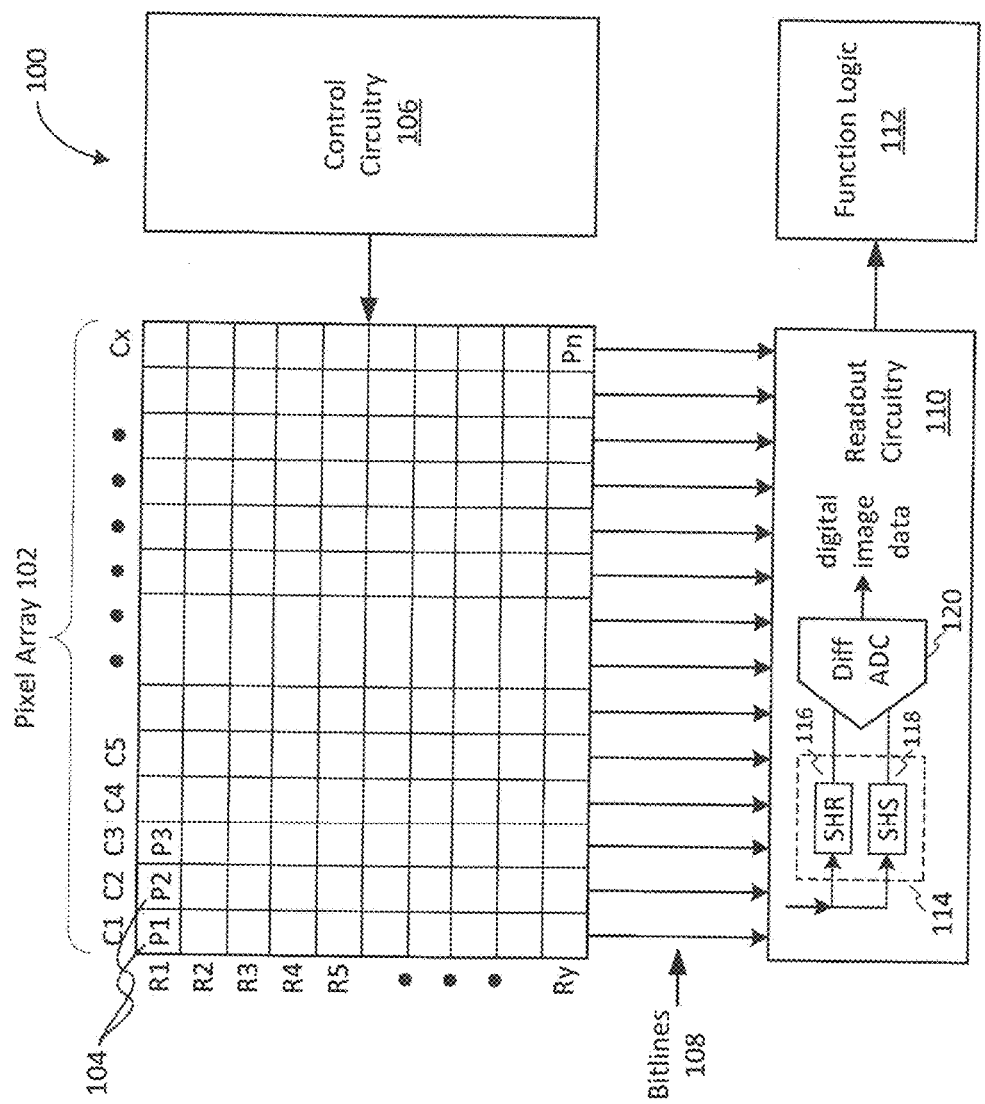
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a differential subrange analog to digital converter (ADC) circuitry with selectable buffered bit capacitor are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 106, column arranged readout bitlines 108, readout circuitry 110, and function logic 112. In one example, pixel array 102 is a two-dimensional (2D) array of photodiodes, or image sensor pixel cells 104 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is read out by readout circuitry 110 and then transferred to function logic 112. The readout circuitry 110 may be coupled to read out image data from the plurality of photodiodes in pixel array 102 through bitlines 108.

As shown in the depicted example, the readout circuitry 110 includes an array of sample and hold circuits 114 coupled to each corresponding bitlines 108. In the example, each one of the sample and hold circuits included in the array of sample and hold circuits 114 is coupled to a corresponding one of the pixel cells 104 of the pixel array 102 to provide a voltage domain global shutter image sensor in accordance with the teachings of the present invention. In particular, each one of the sample and hold circuits included in the array of sample and hold circuits 114 may include a reset memory unit SHR 116 and a signal memory unit SHS 118 configured to store pixel data of reset image and signal image signals, respectively, in the voltage domain. As will be described in greater detail below, the readout circuitry 110 includes a differential ADC 120 coupled to receive the reset and signal image signals from the corresponding one of the pixel cells 104 of the pixel array 102 or from the corresponding one of the bitlines 108 coupled to the pixel array 102. In various examples, the readout circuitry 110 may also include amplification circuitry.

In one example, function logic 112 may simply store the image data or even manipulate the image data by applying post image effects (e.g., crop, rotate, remove red eye, adjust brightness, adjust contrast, or otherwise). In one example, readout circuitry 110 may readout a row of image data at a time along readout column lines (illustrated) or may readout the image data using a variety of other techniques (not illustrated), such as a serial readout or a full parallel readout of all pixels 104 simultaneously.

In one example, imaging system 100 may be included in a digital camera, cell phone, laptop computer, security system, automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
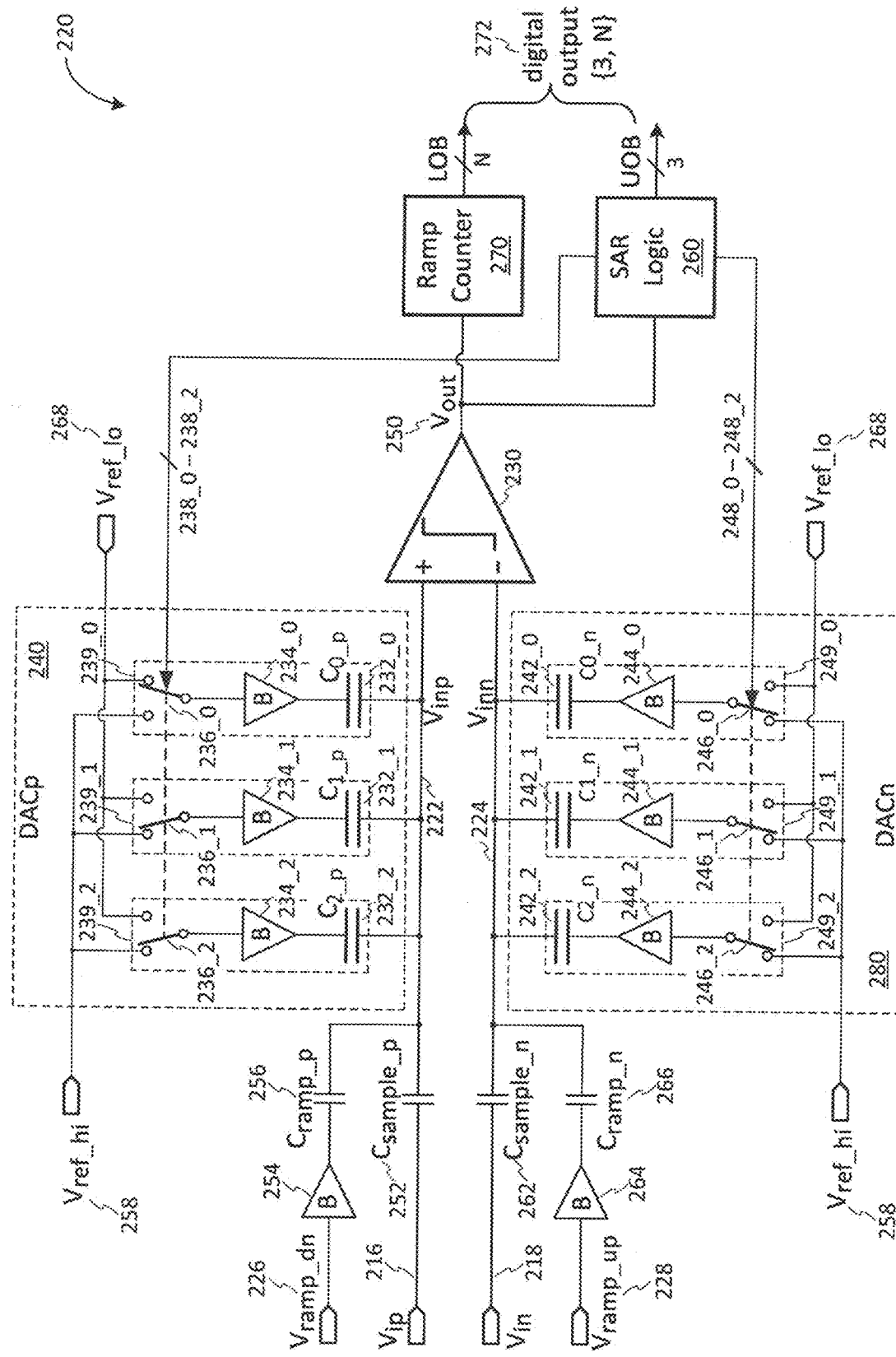
FIG. 2 is a schematic that shows one example of a differential subrange ADC circuit in accordance with the teaching of the present disclosure.

FIG. 2 is a schematic example of a differential subrange ADC circuit 220. The differential subrange ADC circuit 220 of FIG. 2 is one example circuit of ADC 120 as included, for instance, in readout circuitry 110 of FIG. 1. The differential subrange ADC circuitry 220 converts a difference between a first signal input voltage Vip 216 which may be coupled from the reset memory unit SHR 116 and a second signal input voltage Vin 218 which may be coupled from the signal memory unit SHS 118 to a digital output code of M+N bits at the ADC output 272, where M and N are an integers.

In the depicted example of FIG. 2, the differential subrange ADC circuitry 220 is a mixture of a successive approximation register (SAR) ADC circuitry and a ramp ADC circuitry. The SAR ADC circuitry forms a so-called coarse ADC comparison that contributes to the M upper output bits (UOB) of the subrange ADC 220. The SAR ADC circuitry comprises a comparator 230, a top digital-to-analog converter (DAC) DACp 240 and a bottom DAC DACn 280, and a SAR logic 260. The ramp ADC circuitry forms a so-called fine ADC comparison that contributes to the N lower output bits (LOB) of the subrange ADC 220. The ramp ADC circuitry comprises the same comparator 230 that is shared with the SAR ADC circuitry, a first ramp input voltage Vramp_dn 226, a second ramp input voltage Vramp_up 228, and a ramp counter 270.

The differential subrange ADC circuit 220 of FIG. 2 comprises the first signal input voltage Vip 216 coupled to a positive input 222 of the differential comparator 230 through a top sample capacitor Csample_p 252, the second signal input voltage Vin 218 coupled to a negative input 224 of the differential comparator 230 through a bottom sample capacitor Csample_n 262, the top ramp input voltage Vramp_dn 226 coupled to the positive input 222 of the differential comparator 230 through a top ramp buffer 254 and further through a top ramp capacitor Cramp_p 256, the bottom ramp input voltage Vramp_up 228 coupled to the negative input 224 of the differential comparator 230 through a bottom ramp buffer 264 and further through a bottom ramp capacitor Cramp_n 266, the top DAC DACp 240 coupled to the positive input 222 of the differential comparator 230, and the bottom DAC DACn 280 coupled to the negative input 224 of the differential comparator 230.

The top DAC DACp 240 comprises M top buffered bit capacitor fingers 239_0 to 239_M-1, M is an integer. Each top buffered bit capacitor finger 239_i (i=0, 1, . . . , M-1) of the plurality of the M top buffered bit capacitor fingers 239_0 to 239_M-1 comprises a top bit capacitor $C_{i\_p}$ 232_i, a top bit buffer 234_i, and a top bit switch 236_i. A first terminal of the top bit capacitor $C_{i\_p}$ 232_i is coupled to the positive input 222 of the comparator 230. The top bit buffer 234_i is coupled between a second terminal of the top bit capacitor $C_{i\_p}$ 232_i and a first terminal of the top bit switch 236_i. A second terminal of the top bit switch 236_i is coupled to a high reference voltage Vref_hi 258. A third terminal of the top bit switch 236_i is coupled to a low reference voltage Vref_lo 268. The low reference voltage Vref_lw 268 may be connected to the zero voltage ground (GND). The high reference voltage Vref_hi 258 may be connected to Vref. A top switch control signal 238_i determines whether the first terminal of the top bit switch 236_i should be connected to the second or the third terminal of the top bit switch 236-i. The top switch control signals 238_0 to 238_M-1 are outputs of the SAR logic 260 based on a value of an output voltage Vout 250 of the comparator 230.

The bottom DAC DACn 280 comprises M bottom buffered bit capacitor fingers 249_0 to 249_M-1. Each bottom buffered bit capacitor finger 249_i of the plurality of the M bottom buffered bit capacitor fingers 249_0 to 249_M-1 comprises a bottom bit capacitor $C_{i\_n}$ 242_i, a bottom bit buffer 244_i, and a bottom bit switch 246_i. A first terminal of the bottom bit capacitor $C_{i\_n}$ 242_i is coupled to the negative input 224 of the comparator 230. The bottom bit buffer 244_i is coupled between a second terminal of the bottom bit capacitor $C_{i\_n}$ 242_i and a first terminal of the bottom bit switch 246_i. A second terminal of the bottom bit switch 246_i is coupled to the high reference voltage Vref_hi 258. A third terminal of the top bit switch 246_i is coupled to the low reference voltage Vref_lo 268. A bottom switch control signal 248_i determines whether the first terminal of the bottom bit switch 246_i should be connected to the second or the third terminal of the bottom bit switch 246-i. The bottom switch control signals 248_0 to 248_M-1 are outputs of the SAR logic 260 based on the value of the output voltage Vout 250 of the comparator 230.

A capacitance of $C_{i+1\_p}$ equals twice of the capacitance of $C_{i\_p}$. The capacitance of $C_{sample\_p}$ 252 equals twice of a capacitance of $C_{M-1\_p}$. The capacitance of $C_{ramp\_p}$ 256 equals a capacitance of $C_{0\_p}$. A capacitance of $C_{i+1\_n}$ equals twice of the capacitance of $C_{i\_n}$. The capacitance of $C_{sample\_n}$ 262 equals twice of a capacitance of $C_{M-1\_n}$. The capacitance of $C_{ramp\_p}$ 256 equals a capacitance of $C_{0\_n}$. The capacitance of $C_{sample\_p}$ 252 may be equal to the capacitance of $C_{sample\_n}$ 262. The capacitance of $C_{ramp\_p}$ 256 may be equal to the capacitance of $C_{ramp\_n}$ 266. The capacitance of $C_{i\_p}$ 232_i may be equal to the capacitance of $C_{i\_n}$ 242_i.

Figure 3:
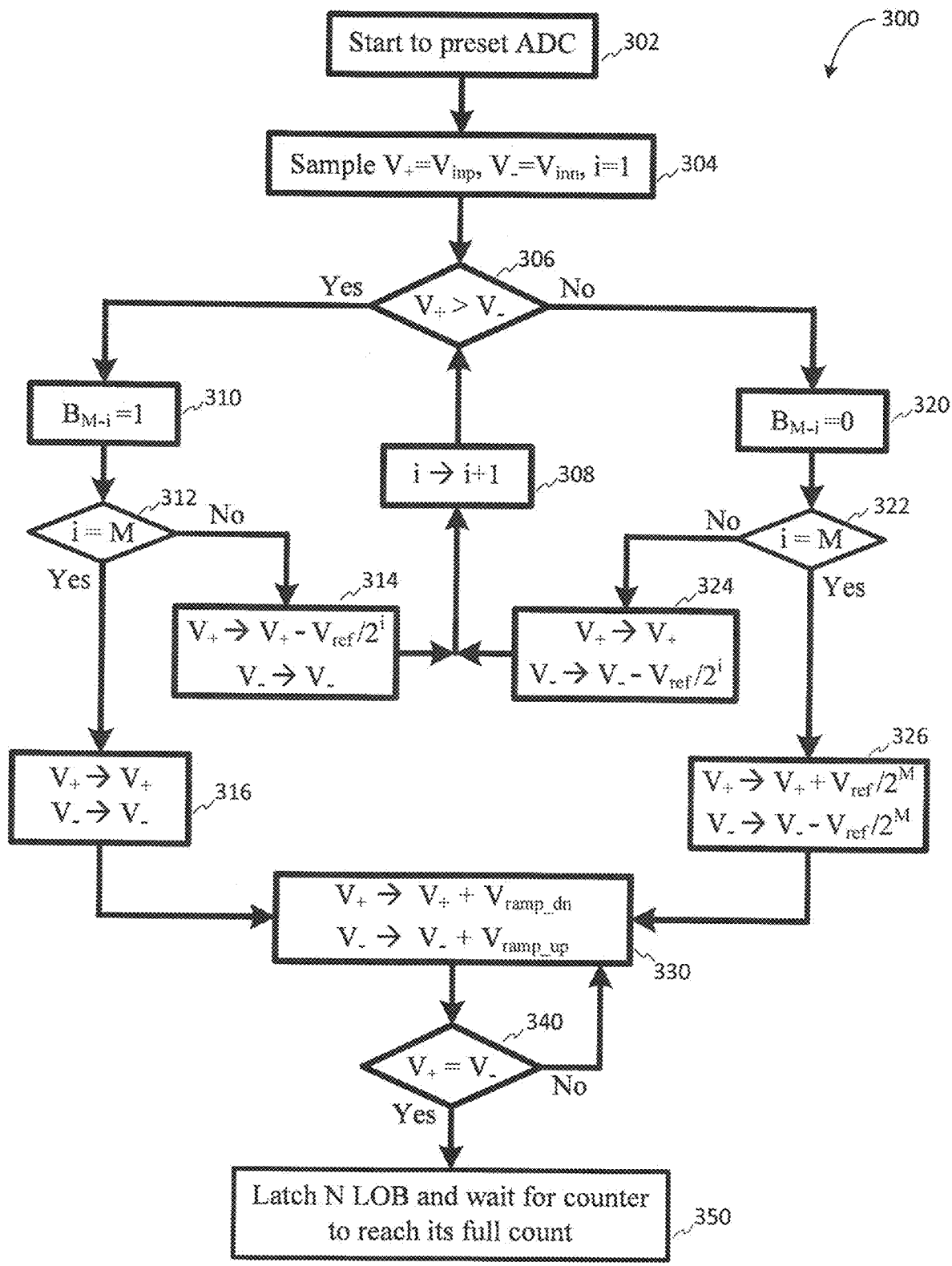
FIG. 3 is a flow chart to demonstrate how the differential subrange ADC circuit as shown in FIG. 2 operates in accordance with the teaching of the present disclosure.

FIG. 3 is a flow chart 300 to demonstrate how the differential subrange ADC circuit 220 as shown in FIG. 2 operates. Assuming the high reference voltage Vref_hi 258 is connected to Vref and the low reference voltage Vref_lw 268 is connected to GND. A SAR ADC operation takes place before a ramp ADC operation. The ramp ADC operation does not happen until sequence 330. During sequence 302, the ADC conversion of the differential subrange ADC circuit 220 starts by connecting the top buffered bit capacitor fingers 239_1 to 239_M-1 and the bottom M buffered bit capacitor fingers 249_0 to 249_M-1 to Vref, meanwhile connect the top buffered bit capacitor finger 239_0 to GND. During sequence 304, Vip 216 is coupled through Csample_p 252 to Vinp 222 where Vinp 222 feeds the non-inverting terminal V+ of the comparator 230, and during the same sequence 304, Vin 218 is coupled through Csample_n 262 to Vinn 224 where Vinn 224 feeds the inverting terminal V− of the comparator 230. Also during sequence 304, integer i is set to 1, where i=1, 2, . . . , M, M is the number of UOB of the differential subrange ADC 220. During sequence 306, comparator 230 compares its V+ to its V−.

If V+ is larger than V− during sequence 306, the bit $B_{M-i}$ (with the assumption that MSB of the SAR logic 260 is $B_{M-1}$ and the LSB $B_0$) of the SAR logic 260 is set to a binary value 1 in sequence 310. Sequence 310 is followed by sequence 312. During sequence 312, value i is compared with value M. If i is not equal to M, SAR ADC has not collected all of its M UOB yet and needs to continue its SAR operation. Sequence 312 is followed by sequence 314 under the condition of i not being equal to M. During sequence 314, since $B_{M-i}$ of the SAR logic 260 is set to 1, top switch control signal 238_M-i switches the top buffered bit capacitor finger 239_M-i from Vref to 0 (GND), bottom switch control signal 248_M-i keeps the bottom buffered bit capacitor finger 249_M-i connected to Vref. As a result, sequence 314 lowers the Vinp 222 at the V+ terminal of the comparator 230 by Vref/$2^i$ and maintains the Vinn 224 to the same level at V− terminal of the comparator 230. Sequence 314 is followed by sequence 308. During sequence 308, value i is incremented by 1 (to i+1). Sequence 308 is followed by sequence 306. This time around, during the iteration of sequence 306 with an incremented i, the comparator 230 compares the updated voltage Vinp 222 achieved during the immediate earlier sequence 314 at V+ with the unchanged Vinn 244 at V−. Determined by the output voltage Vout 250 of the comparator 230 during a repeated sequence 306, either sequence 310 or sequence 320 will follow.

Back to sequence 312, where value i is compared with value M. If i=M, SAR ADC has collected all of its M UOB for the digital output 272, including its LSB $B_0$=1 achieved in sequence 310, and is ready to move on to the ramp ADC operation of the differential subrange ADC. Under the condition of i=M, sequence 314 is followed by sequence 316. During sequence 316, both Vinp 222 and Vinn 224 maintain their previously updated values to act on V+ and V− of the comparator 230, respectively. Sequence 316 is followed by sequence 330.

If V+ is not larger than V− during sequence 306, the bit $B_{M-i}$ of the SAR logic 260 is set to a binary value 0 in sequence 320. Sequence 320 is followed by sequence 322. During sequence 322, value i is compared with value M. If i is not equal to M, SAR ADC has not collected all of its M UOB yet and needs to continue its SAR operation. Sequence 322 is followed by sequence 324 under the condition of i not being equal to M. During sequence 324, since $B_{M-i}$ of the SAR logic 260 is set to 0 in sequence 320, the top switch control signal 238_M-i remains the top buffered bit capacitor finger 239_M-i to be connected to Vref, bottom switch control signal 248_M-i switches the bottom buffered bit capacitor finger 249_M-i from Vref to 0 (GND). As a result, sequence 324 lowers the Vinn 224 at the V− terminal of the comparator by Vref/$2^i$ and maintains the Vinp 222 to the same level at V+ terminal of the comparator. Sequence 324 is followed by sequence 308. During sequence 308, the same as before, value i is incremented by 1. Sequence 308 is followed by sequence 306. This time around again, during the iteration of sequence 306 with an incremented i, the comparator 230 compares the updated voltage Vinn 224 achieved during the immediate earlier sequence 324 at V− with the unchanged Vinp 242 at V+. Based on the outcome of the comparator 230 during a repeated sequence 306, either sequence 310 or sequence 320 will follow.

Back to sequence 322, where value i is compared with value M. If i=M, SAR ADC has collected all of its M UOB for the digital output 272, including its LSB $B_0$=0 achieved in sequence 320, and is ready to move on to the ramp ADC operation of the differential subrange ADC. Under the condition of i=M, sequence 322 is followed by sequence 326. During sequence 326, Vinp 222 will be forced to increase its voltage by Vref/$2^M$ which is achieved by switching the top buffered bit capacitor finger 239_0 from its preset value 0 (GND) to Vref to act on V+ of the comparator 230 and Vinn 224 will be forced to decrease its voltage by Vref/$2^M$ which is achieved by switching the bottom buffered bit capacitor finger 249_0 from its preset Vref to 0 (GND) to act on V− of the comparator 230, respectively. Sequence 326 is followed by sequence 330.

During sequence 330, the first ramp input voltage Vramp_dn 226 which is a linear ramp down voltage is coupled to Vinp 222 through the top ramp buffer 254 and the top ramp capacitor $C_{ramp\_p}$ 256, and the second ramp input voltage Vramp_up 228 which is a linear ramp up voltage is coupled to Vinn 224 through the bottom ramp buffer 264 and the bottom ramp capacitor Cramp_n 266.

Sequence 330 is followed by sequence 340. During sequence 340, comparator 230 compares its V+ to V− (Vinp 222 to Vinn 224). The output voltage Vout 250 of the comparator 230 will not flip its voltage until the value of Vinp 222 as a ramping-down action of Vramp_dn 226 and the value Vinn 224 as a ramping-up action of Vramp_up 228 have reach the very same value. When V+=V−, sequence 340 is followed by sequence 350. During sequence 350, the N LOB values of digital output are latched. In combining with the $B_{M-1}$ through $M_0$ received during sequence 310 and/or sequence 320 which serves as the M UOB, every single bit of the digital output 272 bits M+N has achieved. During the last step, sequence 350 waits for the counter of the ramp counter 270 to advance to its full count (to make sure that all ramp counters 270 in a given readout row finish their counts). After that, the conversion of the differential subrange ADC has accomplished.

Figure 4A:
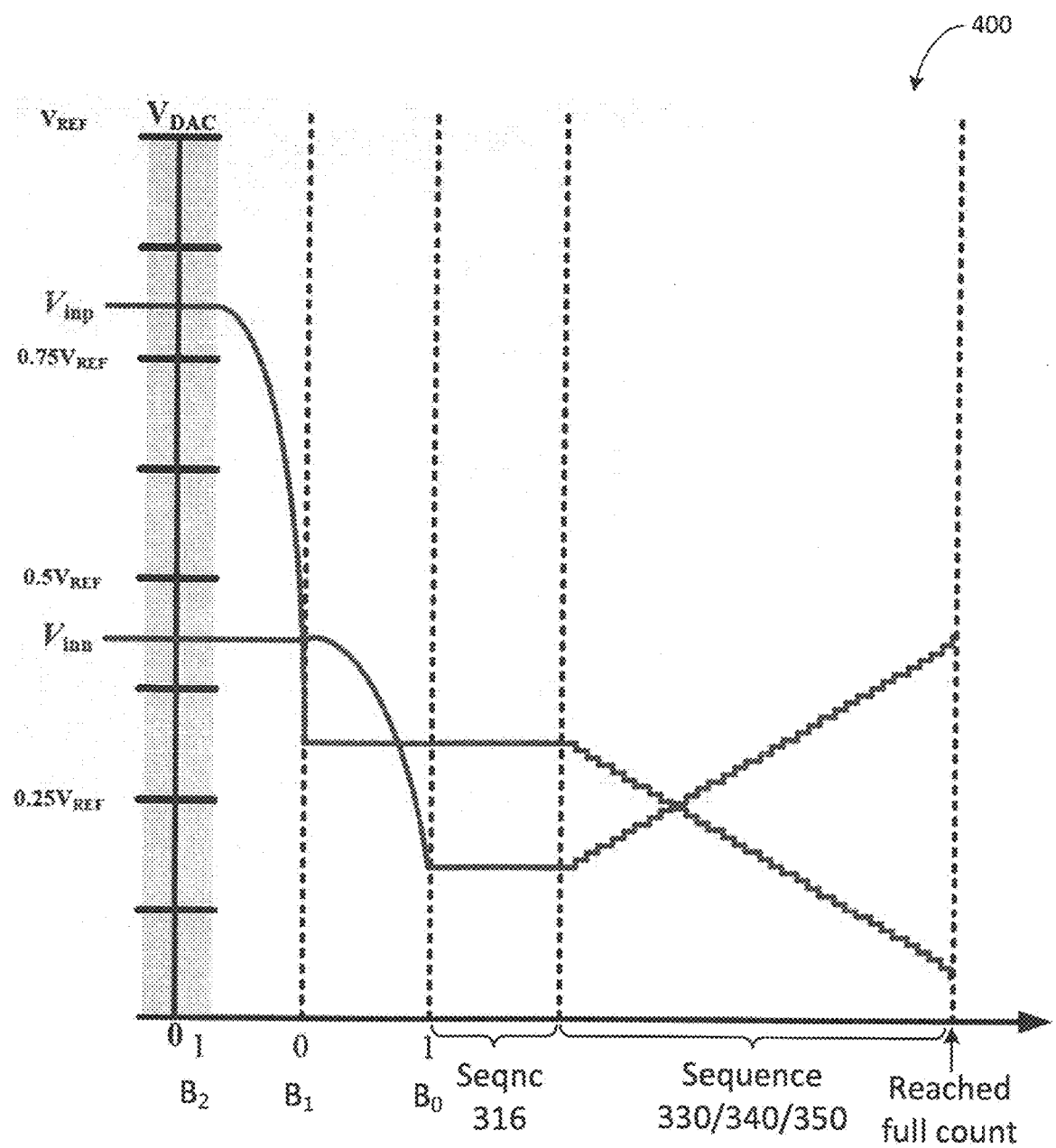
FIG. 4A is a waveform to serve as one embodiment to demonstrate how the differential subrange ADC circuit of FIG. 2 operates and how the flow chart of FIG. 3 works in accordance with the teaching of the present disclosure.

FIG. 4A is a waveform 400 to serve as one embodiment to demonstrate how the differential subrange ADC circuit 220 of FIG. 2 operates and how the flow chart 300 of FIG. 3 works. M=3 is what FIG. 2 depicted with its DACp 240 and DACn 280. Waveform 400 can be understood by setting M=3 to the flow chart 300 of FIG. 3.

For the waveform 400 of FIG. 4A, during sequence 302, the ADC conversion of the differential subrange ADC circuit 220 of FIG. 2 starts by connecting the 2 top buffered bit capacitor fingers 239_1 to 239_2 and the 3 bottom buffered bit capacitor fingers 249_0 to 249_2 to Vref, meanwhile connect the top buffered bit capacitor fingers 239_0 to GND. During sequence 304, Vip 216 is coupled through Csample_p 252 to Vinp 222 where Vinp 222 feeds the non-inverting terminal V+ of the comparator 230, and during the same sequence 304, Vin 218 is coupled through Csample_n 262 to Vinn 224 where Vinn 224 feeds the inverting terminal V− of the comparator 230. Also during sequence 304, integer i is set to 1, where i=1, 2, 3, 3 is the number of UOB of the differential subrange ADC 220 in this example. During sequence 306, comparator 230 compares V+ to V−.

Since it shows that Vinp>Vinn in waveform 400 at time 0, V+ is larger than V− during sequence 306, a bit $B_2$ of the SAR logic 260 is set to 1 in sequence 310 as shown in FIG. 4A. Sequence 310 is followed by sequence 312. During sequence 312, value i=1 is compared with value M=3. Since i=1 is not equal to M=3, SAR ADC has not collected all of its 3 UOB yet and needs to continue its SAR operation. Sequence 312 is followed by sequence 314 under the condition of 1 not being equal to 3. During sequence 314, since $B_2$ of the SAR logic 260 is set to 1, top switch control signal 238_2 switches a top buffered bit capacitor finger 239_2 from Vref to 0 (GND), bottom switch control signal 248_2 remains the bottom buffered bit capacitor finger 249_2 to be unchanged at Vref. As a result, sequence 314 lowers the Vinp 222 at the V+ terminal of the comparator by Vref/2 and maintains the Vinn 224 to the same level at V− terminal of the comparator 230. Sequence 314 is follow ed by sequence 308. During sequence 308, value i is incremented from 1 to 2. Sequence 308 is followed by sequence 306. This time around, during the iteration of sequence 306 with an incremented i=2, the comparator 230 compares the updated voltage Vinp 222 which is lowered by Vref/2 during the immediate earlier sequence 314 at V+ with the unchanged Vinn 244 at V−. Since the comparator 230 during a repeated sequence 306 indicates that V+>V− now as shown as in FIG. 4A, sequence 320 will follow.

During sequence 320 with i=2, bit $B_1$ is set to 0. Sequence 320 is followed by sequence 322. During sequence 322, value i=2 is compared with value M=3. Since i=2 is not equal to M=3, SAR ADC has not collected all of its 3 UOB yet and needs to continue its SAR operation. Following sequence 322 under the condition of i=2 not being equal to M=3, during sequence 324, top switch control signal 238_1 keeps the top buffered bit capacitor linger 239_1 to be connected to Vref, bottom switch control signal 248_1 switches the bottom buffered bit capacitor finger 249_1 from Vref to 0 (GND). As a result, sequence 324 maintains the Vinp 222 at the V+ terminal of the comparator 230 to the same level and lower the Vinn 224 by Vref/4 at V− terminal of the comparator 230. Sequence 324 is followed by sequence 308. During sequence 308, value i is incremented from 2 to 3. Sequence 308 is followed by sequence 306. During the iteration of sequence 306 with an incremented i=3, the comparator 230 compares the unchanged Vinp 222 at V+ with an updated voltage Vinn 224 which is lowered by Vref/4 during the immediate earlier sequence 324 at V−. Since the comparator 230 during a repeated sequence 306 indicates that V+>V− now as shown in FIG. 4A, sequence 310 will follow.

Since it shows that Vinp>Vinn, V+ is larger than V− during sequence 306, bit $B_0$ of the SAR logic 260 is set to 1 in sequence 310 as shown in FIG. 4A. Sequence 310 is followed by sequence 312. During sequence 312, i=3 is compared with M=3. Since i=3 is equal to M=3, SAR ADC has collected all of its 3 UOB of for the digital output 272, and is ready to move on to the ramp ADC operation of the subrange ADC. Sequence 312 is followed by sequence 316 due to i=M and $B_0$=1 conditions. During sequence 316, since $B_0$ of the SAR logic 260 is set to 1, top switch control signal 238_0 keeps the top buffered bit capacitor finger 239_0 unchanged at 0 (GND), bottom switch control signal 248_0 keeps the bottom buffered bit capacitor finger 249_2 unchanged at Vref. As a result, sequence 316 maintains both the Vinp 222 at the V+ terminal of the comparator 230 and the Vinn 224 at V− terminal of the comparator 230 the same due to the unique value of $B_0$=1 achieved during sequence 310, as shown in FIG. 4A. Sequence 316 is followed by sequence 330.

During sequence 330, the first ramp input voltage Vramp_dn 226 which is assumed to be a linear ramping-down voltage is coupled to Vinp 222, and the second ramp input voltage Vramp_up 228 which is assumed to be a linear ramping-up voltage is coupled to Vinn 224.

Sequence 330 is followed by sequence 340. During sequence 340, comparator 230 compares its V+ to V− (Vinp 222 to Vinn 224). The output Vout 250 of the comparator 230 will not flip its voltage until the value of Vinp 222 as an action of ramping-down Vramp_dn 226 and the value Vinn 224 as an action of ramping-up Vramp_up 228 have reach the very same value, as shown as an "X" cross in FIG. 4A. When V+=V−, sequence 340 is followed by sequence 350. During sequence 350, the N LOB values of digital output are latched in the ramp counter 270. In addition to the $B_2$=1, $B_1$=0, and $B_0$=1 received during sequence 310 and/or sequence 320 which serves as the M=3 UOB, every single bit of the digital output 272 bits M+N has achieved. As the last step of sequence 350, wait for Vramp_dn 226 to reach its minimum value, and/or, wait for Vramp_up 228 to reach its maximum value. This is the same as waiting for the counter inside the ramp counter 270 to reach its fully allowed maximum count number. The conversion of the differential subrange ADC is accomplished at this point. This is shown as the waveforms 400 where Vinp 222 and Vinn 224 reach their leftmost termination points, marked as "Reached full count" in FIG. 4A.

Figure 4B:
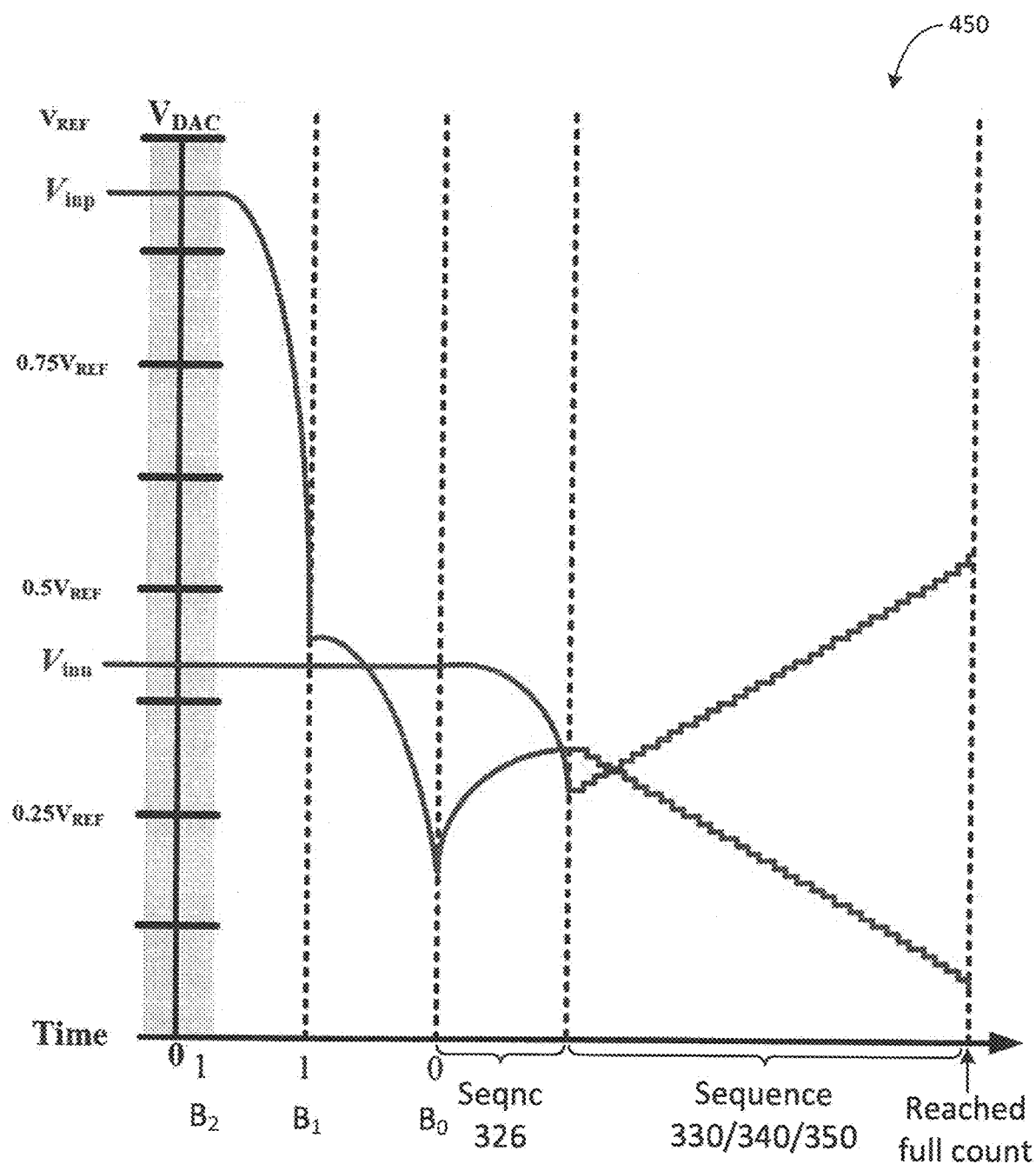
FIG. 4B is a waveform to serve another example to the earlier embodiment shown in FIG. 4A to demonstrate how the differential subrange ADC circuit of FIG. 2 operates and how the flow chart of FIG. 3 works in accordance with the teaching of the present disclosure.

FIG. 4B is a waveform 450 to serve another example of the earlier embodiment shown in FIG. 4A to demonstrate how the differential subrange ADC circuit 220 of FIG. 2 operates under a differential $B_0$ value and how the flow chart 300 of FIG. 3 works. Again, M=3 is what FIG. 3 depicted with its DACp 240 and DACn 280. Waveform 450 can be understood by setting M=3 to the flow chart 300 of FIG. 3.

For the waveform 450 of FIG. 4B, during sequence 302, the ADC conversion of the differential subrange ADC circuit 220 of FIG. 2 starts by connecting the 2 top buffered bit capacitor fingers 239_1 to 239_2 and the 3 bottom buffered bit capacitor fingers 249_0 to 249_2 to Vref, meanwhile connect the top buffered bit capacitor fingers 239_0 to GND. During sequence 304, Vip 216 is coupled through Csample_p 252 to Vinp 222 where Vinp 222 feeds the non-inverting terminal V+ of the comparator 230, and during the same sequence 304, Vin 218 is coupled through Csample_n 262 to Vinn 224 where Vinn 224 feeds the inverting terminal V− of the comparator 230. Also during sequence 304, integer i is set to 1, where i=1, 2, 3, M=3 is the number of UOB of the subrange ADC 220. During sequence 306, comparator 230 compares V+ to V−.

Since it shows that Vinp>Vinn in waveform 450 at time 0, V+ is larger than V− during sequence 306, a bit $B_2$ of the SAR logic 260 is set to 1 in sequence 310 as shown in FIG. 4B. Sequence 310 is followed by sequence 312. During sequence 312, i=1 is compared with M=3. Since i=1 is not equal to M=3, SAR ADC has not collected all of its 3 UOB yet and needs to continue its SAR operation. Sequence 312 is followed by sequence 314 under the condition of 1 not being equal to 3. During sequence 314, since $B_2$ of the SAR logic 260 is set to 1 in sequence 310, top switch control signal 238_2 switches the top buffered bit capacitor finger 239_2 from Vref to 0 (GND), bottom switch control signal 248_2 remains the bottom buffered bit capacitor finger 249_2 to be unchanged at Vref. As a result, sequence 314 lowers the Vinp 222 at the V+ terminal of the comparator by Vref/2 and maintains the Vinn 224 to the same level at V− terminal of the comparator. Sequence 314 is followed by sequence 308. During sequence 308, value i is incremented from 1 to 2. Sequence 308 is followed by sequence 306. This time around, during the iteration of sequence 306 with an incremented i=2, the comparator 230 compares the updated voltage Vinp 222 which is lowered by Vref/2 during the immediate earlier sequence 314 at V+ with the unchanged Vinn 244 at V−. Since the comparator 230 during a repeated sequence 306 indicates that V+>V− still, again, sequence 310 will follow.

During sequence 310, for i=2, a bit $B_1$ of the SAR logic 260 is set to 1 as shown in FIG. 4B. Sequence 310 is followed by sequence 312. During sequence 312, i=2 is compared with M=3. Since i=2 is not equal to M=3, SAR ADC has not collected all of its M=3 UOB yet and needs to continue its SAR operation. Sequence 312 is followed by sequence 314 under the condition of i=2 not being equal to M=3. During sequence 314, since $B_1$ of the SAR logic 260 is set to 1, top switch control signal 238_1 switches the top buffered bit capacitor finger 239_1 from Vref to 0 (GND), bottom switch control signal 248_1 remains the bottom buffered bit capacitor finger 249_1 to be unchanged at Vref. As a result, sequence 314 lowers the Vinp 222 at the V+ terminal of the comparator by Vref/4 and maintains the Vinn 224 to the same level at V− terminal of the comparator 230. Sequence 314 is followed by sequence 308. During sequence 308, value i is incremented from 2 to 3. Sequence 308 is followed by sequence 306. Again, during the iteration of sequence 306 with an incremented i=3, the comparator 230 compares the updated voltage Vinp 222 which is further lowered by Vref/4 during the immediate earlier sequence 314 at V+ with the unchanged Vinn 244 at V−. Since the comparator 230 during a repeated sequence 306, for i=3, indicates that V+<V−, sequence 320 will follow next, as shown in FIG. 4B.

During sequence 320 with i=3, bit $B_0$ is set to 0. Sequence 320 is followed by sequence 322. During sequence 322, value i=3 is compared with M=3. Since i=3 equals M=3, SAR ADC has collected all of its M=3 UOB and is ready to move on to sequence 326.

During sequence 326, under condition of M=3 and $B_0$=0, top switch control signal 238_0 switches the top buffered bit capacitor finger 239_1 from 0V (GND) to Vref, bottom switch control signal 248_0 switches the bottom buffered bit capacitor finger 249_0 from Vref to 0 (GND). As a result, sequence 326 increases the value of Vinp 222 by Vref/8 and decreases the value of Vinn 224 by Vref/8 before these new values are sent to V+ and V− of the comparator 230, respectively, as shown in FIG. 4B. Sequence 326 is followed by sequence 330.

During sequence 330, the first ramp input voltage Vramp_dn 226 which is a linear rampdown voltage is coupled to Vinp 222, and the second ramp input voltage Vramp_up 228 which is a linear ramp-up voltage is coupled to Vinn 224.

Sequence 330 is followed by sequence 340. During sequence 340, comparator 230 compares its V+ to V− (i.e., Vinp 222 compares to Vinn 224). The output Vout 250 of the comparator 230 will not flip its voltage until the value of Vinp 222 as an action of the ramping-down Vramp_dn 226 and the value Vinn 224 as an action of the ramping-up Vramp_up 228 have reach the very same value, as shown as an "X" cross in FIG. 4B. When V+=V−, sequence 340 is followed by sequence 350. During sequence 350, the N LOB values of digital output are latched in the ramp counter 270. In combining with the $B_2$=1, $B_1$=1, and $B_0$=0 received during sequence 310 and/or sequence 320 which serves as the M=3 UOB, every single bit of the digital output 272 bits M+N has achieved. As the last step of sequence 350, wait for Vramp_dn 226 to reach its minimum value, and/or, wait for Vramp_up 228 to reach its maximum value. This is the same as waiting for the counter inside the ramp counter 270 to reach its fully allowed count number. The conversion of the differential subrange ADC is accomplished at this point. This is shown as the waveforms 450 where Vinp 222 and Vinn 224 reach their leftmost termination points, marked as "Reached full count" in FIG. 4B.

Figure 5:
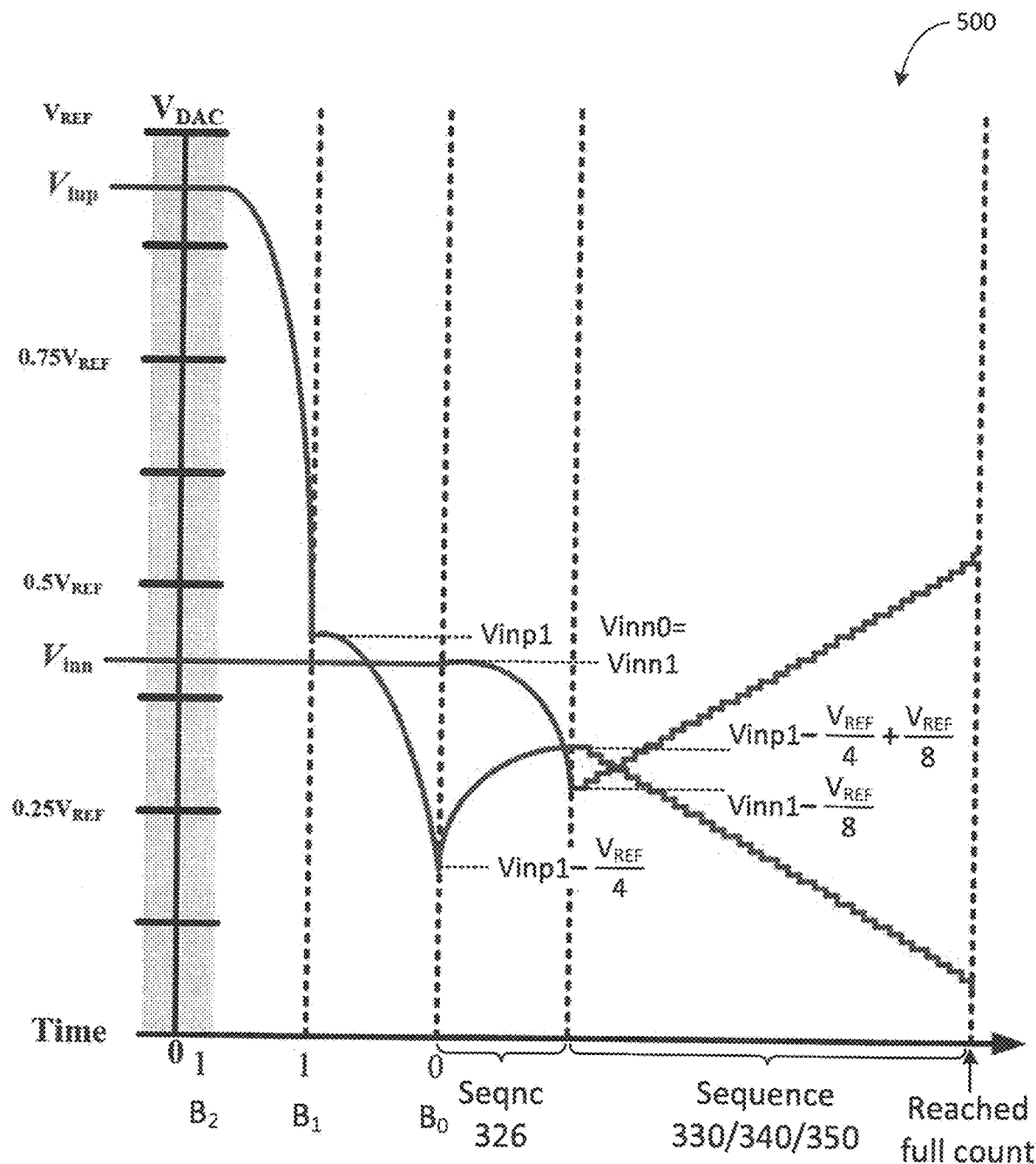
FIG. 5 is a waveform to justify the operations of a switch sequence in FIG. 3.

For FIG. 4B, during sequence 326, the reasons to increase Vinp 222 by Vref/8 and to decrease Vinn 224 by Vref/8 is demonstrated in FIG. 5.

FIG. 5 is a waveform 500 to justify the operations of sequence 326 of FIG. 3. Sequence 326 comes from sequence 322. During Sequence 322, when i=3, bit $B_0$ is set to 0 for the reason that Vinp0=Vinp1−$V_{REF}$/4 is less than Vinn0=Vinn1 as shown. But it was the two values of Vinp1 and Vinn1 reached at the point of $B_1$ marks the residue differential value (Vinp1−Vinn1) for the ramp ADC to further convert in this example. Since i=3=M in sequence 322, sequence 326 is reached next. During sequence 326, top switch control signal 238_0 switched the top buffered bit capacitor finger 239_0 from 0 (GND) to Vref, bottom switch control signal 248_0 switches the bottom buffered bit capacitor finger 249_0 from Vref to 0 (GND). As a result, sequence 326 increases the Vinp 222 at the V+ terminal of the comparator 230 by Vref/8 from the previous reduced of Vref/4 and decreases the Vinn 224 by Vref/8 at V− terminal of the comparator 230. That helps to maintain the same differential residue value of ((Vinp1−VREF/4+VREF/8)−(vinn1−VREF/8))=(Vinp1−Vinn1). Sequence 330 takes it over from here for Vramp_dn 226 to ramp downward and Vramp_up 228 to ramp upward to come across at the same value until V+=V− in sequence 340. Sequence 340 is followed by sequence 350 when the full count is reached by the counter after the N LOB are latched as shown concluded to the right most of waveform 500, marked as "Reached full count" in FIG. 5.

Since a subrange ADC is a combined ADC with a SAR ADC providing UOB output bits and a ramp ADC providing LOB output bits, it requires exponentially fewer comparators than flash ADCs. It also consumes less silicon area and less power. It takes advantages of a SAR ADC with just enough resolution for UOB at relative high speed, faster than a ramp ADC acted alone throughout, and a ramp ADC has relative low speed but with simpler circuit. Subrange ADC becomes a natural choice for automotive and security applications which requires high dynamic range of more than 12-bit resolution to deal with very bright lights.

The above description of illustrated examples of the invention, including what is described in the Abstract, is not intended to be exhaustive or to limit the invention to the precise forms disclosed. While specific examples of the invention are described herein for illustrative proposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A differential subrange analog-to-digital converter (ADC), comprising:
  a first sample capacitor coupled between a first signal input voltage and a first input of a comparator;
  a first ramp buffer coupled between a first ramp generator and a first terminal of a first ramp capacitor, wherein a second terminal of the first ramp capacitor is coupled to the first input of the comparator;
  a first digital-to-analog converter (DAC) comprising top M buffered bit capacitor fingers, wherein M is an integer, wherein each one of the top M buffered bit capacitor fingers comprises a top bit capacitor, a top bit buffer, and a top bit switch, wherein a first terminal of the top bit capacitor is coupled to the first input of the comparator, and wherein the top bit buffer is coupled between a second terminal of the top bit capacitor and a first terminal of the top bit switch;
  a second sample capacitor coupled between a second signal input voltage and a second input of the comparator;
  a second ramp buffer coupled between a second ramp generator and a first terminal of a second ramp capacitor, wherein a second terminal of the second ramp capacitor is coupled to the second input of the comparator;
  a second digital-to-analog converter (DAC) comprising bottom M buffered bit capacitor fingers, wherein each one of the bottom M buffered bit capacitor fingers comprises a bottom bit capacitor, a bottom bit buffer, and a bottom bit switch, wherein a first terminal of the bottom bit capacitor is coupled to the second input of the comparator, and wherein the bottom bit buffer is coupled between a second terminal of the bottom bit capacitor and a first terminal of the bottom bit switch;
  a successive approximation register (SAR) logic, wherein an output of the comparator is input to the SAR logic, and the SAR logic latches and provides M upper output bits (UOB) of the differential subrange ADC determined by an output value of the output of the comparator, wherein the SAR logic outputs both top M control bits based on the M UOB and bottom M control bits based on the M UOB, wherein an i-th bit of the top M control bits determines coupling between the first terminal of an i-th top bit switch and a second terminal of the i-th top bit switch or coupling between the first terminal of the i-th top bit switch and a third terminal of the i-th top bit switch, wherein i is an integer equal or less titan M and equal or larger than 0, and wherein an i-th bit of the bottom M control bits determines coupling between the first terminal of an i-th bottom bit switch and a second terminal of the i-th bottom bit switch or coupling between the first terminal of the i-th bottom bit switch and a third terminal of the i-th bottom bit switch; and
  a ramp counter, wherein the output of the comparator is input to the ramp counter, and the ramp counter latches and provides N lower output bits (LOB) of the differential subrange ADC, wherein N is an integer.

2. The differential subrange ADC of claim 1, wherein a high reference voltage is coupled to the second terminals of the top bit switches of each top M buffered bit capacitor fingers and to the second terminals of the bottom bit switches of each bottom M buffered bit capacitor fingers, and wherein a low reference voltage is coupled to the third terminals of the top bit switches of each top M buffered bit capacitor fingers and to the third terminals of the bottom bit switches of each bottom M buffered bit capacitor fingers.

3. The differential subrange ADC of claim 2, wherein the low reference voltage is a zero voltage.

4. The differential subrange ADC of claim 1, wherein the M UOB and the N LOB comprise all digital output bits of the differential subrange ADC.

5. The differential subrange ADC of claim 1, wherein the first and second ramp buffers and each top and bottom bit buffers are source followers.

6. The differential subrange ADC of claim 1, wherein the first and second ramp buffers and each top and bottom bit buffers are operational amplifiers with unity gain.

7. The differential subrange ADC of claim 1, wherein a capacitance of the first ramp capacitor equals a capacitance of a top bit capacitor of a first top M buffered bit capacitor finger of the top M buffered bit capacitor fingers, wherein a capacitance of the second ramp capacitor equals a capacitance of the bottom bit capacitor of a first bottom M buffered bit capacitor finger of the bottom M buffered bit capacitors fingers, and wherein the capacitance of the second ramp capacitor equals the capacitance of the first ramp capacitor.

8. The differential subrange ADC of claim 1, wherein a capacitance of the first sample capacitor is twice as much as a capacitance of a top bit capacitor of a M-th buffered bit capacitor finger of the top M buffered bit capacitor fingers, wherein a capacitance of the second sample capacitor is twice as much as a capacitance of the bottom bit capacitor of a M-th buffered bit capacitor finger of the bottom M buffered bit capacitor fingers, and wherein the capacitance of the second sample capacitor equals the capacitance of the first sample capacitor.

9. The differential subrange ADC of claim 1, wherein a capacitance of a top bit capacitor of a second buffered bit capacitor finger of the top M buffered bit capacitor fingers is twice as much as a capacitance of the top bit capacitor of a first buffered bit capacitor finger of the top M buffered bit capacitor fingers, wherein a capacitance of a top bit capacitor of a third buffered bit capacitor finger of the the top M buffered bit capacitor fingers is twice as much as a capacitance of the top bit capacitor of the second buffered bit capacitor finger of the top M buffered bit capacitor fingers, wherein a capacitance of a bottom bit capacitor of a second buffered bit capacitor finger of the bottom M buffered bit capacitor fingers is twice as much as a capacitance of a bottom bit capacitor of the first buffered bit capacitor finger of the bottom M buffered bit capacitor fingers, and wherein a capacitance of a bottom bit capacitor of a third buffered bit capacitor finger of the bottom M buffered bit capacitor fingers is twice as much as a capacitance of the bottom bit capacitor of the second buffered bit capacitor finger of the bottom M buffered bit capacitor fingers.

10. The differential subrange ADC of claim 1, wherein a capacitance of the top bit capacitor of an i-th buffered bit capacitor finger of the top M buffered bit capacitor fingers is twice as much as a capacitance of the top bit capacitor of an (i-1)-th buffered bit capacitor finger of the top M buffered bit capacitor fingers, wherein i is an integer equal or larger than 0 and equal or less than M-1, and wherein a capacitance of the bottom bit capacitor of an i-th buffered bit capacitor finger of the bottom M buffered bit capacitor fingers is twice as much as a capacitance of the bottom bit capacitor of an (i-1)-th buffered bit capacitor finger of the bottom M buffered bit capacitor fingers.

11. The differential subrange ADC of claim 1, wherein a value of a least significant bit of the M UOB, determines whether a first terminal of a top bit switch of a first buffered bit capacitor finger of the top M buffered bit capacitor fingers is coupled to the second terminal of the top bit switch of the first buffered bit capacitor finger of the top M buffered bit capacitor fingers or the first terminal of the top bit switch of the first buffered bit capacitor finger of the top M buffered bit capacitor fingers is coupled to the third terminal of the top bit switch of the first buffered bit capacitor finger of the top M buffered bit capacitor fingers.

12. The differential subrange ADC of claim 1, wherein the first ramp generator always ramps in one direction, and wherein the second ramp generator always ramps in an opposite direction of the first ramp generator.

13. A differential subrange analog-to-digital converter (ADC) image sensing system, comprising:
a pixel array including a plurality of pixels;
control circuitry coupled to the pixel array to control operation of the pixel array;
readout circuitry coupled to the pixel array through a plurality of bitlines to read out analog image data from the pixel array, wherein the readout circuitry comprises a plurality of sample and hold circuits and a differential subrange analog-to-digital converter (ADC) to convert analog image data to digital image data, wherein the differential subrange ADC comprises:
a first sample capacitor coupled between a first signal input voltage and a first input of a comparator;
a first ramp buffer coupled between a first ramp generator and a first terminal of a first ramp capacitor, wherein a second terminal of the first ramp capacitor is coupled to the first input of the comparator;
a first digital-to-analog converter (DAC) comprising top M buffered bit capacitor fingers, wherein M is an integer, wherein each one of the top M buffered bit capacitor fingers comprises a top bit capacitor, a top bit buffer, and a top bit switch, wherein a first terminal of the top bit capacitor is coupled to the first input of the comparator, and wherein the top bit buffer is coupled between a second terminal of the top bit capacitor and a first terminal of the top bit switch;
a second sample capacitor coupled between a second signal input voltage and a second input of the comparator;
a second ramp buffer coupled between a second ramp generator and a first terminal of a second ramp capacitor, wherein a second terminal of the second ramp capacitor is coupled to a second input of the comparator;
a second digital-to-analog converter (DAC) comprising bottom M buffered bit capacitor fingers, wherein each one of the bottom M buffered bit capacitor fingers comprises a bottom bit capacitor, a bottom bit buffer, and a bottom bit switch, wherein a first terminal of the bottom bit capacitor is coupled to the second input of the comparator, and wherein the bottom bit buffer is coupled between a second terminal of the bottom bit capacitor and a first terminal of the bottom bit switch;
a successive approximation register (SAR) logic, wherein an output of the comparator is input to the SAR logic, and the SAR logic latches and provides M upper output bits (UOB) of the differential subrange ADC determined by an output value of the output of the comparator, wherein the SAR logic outputs both top M control bits based on the M UOB and bottom M control bits based on the M UOB, wherein an i-th bit of the top M control bits determines coupling between the first terminal of an i-th top bit switch and a second terminal of the i-th top bit switch or coupling between the first terminal of the i-th top bit switch and a third terminal of the i-th top bit switch, wherein i is an integer equal or less than M and equal or larger than 0, and wherein an i-th of the bottom M control bits to determines coupling between the first terminal of an i-th bottom bit switch and a second terminal of the i-th bottom bit switch or coupling between the first terminal of the i-th bottom bit switch and a third terminal of the i-th bottom bit switch; and
a ramp counter, wherein the output of the comparator is input to the ramp counter, and the ramp counter latches and provides N lower output bits (LOB) of the differential subrange ADC, wherein N is an integer; and
a function logic coupled to the readout circuitry.

14. The differential subrange ADC image sensing system of claim 13, wherein each sample and hold circuit of the plurality of sample and hold circuits is coupled to each corresponding bitline of the plurality of bitlines, and wherein each one of the sample and hold circuit comprises a reset memory unit SHR to store reset voltage and a signal memory unit SHS store signal voltage.

15. The differential subrange ADC image sensing system of claim 13, wherein a high reference voltage is coupled to the second terminals of the top bit switches of each top M buffered bit capacitor fingers and to the second terminals of the bottom bit switches of each bottom M buffered bit capacitor fingers, and wherein a low reference voltage is coupled to the third terminals of the top bit switches of each top M buffered bit capacitor fingers and to the third terminals of the bottom bit switches of each bottom M buffered bit capacitor fingers.

16. The differential subrange ADC image sensing system of claim 15, wherein the low reference voltage is a zero voltage.

17. The differential subrange ADC image sensing system of claim 13, wherein the M UOB and the N LOB comprise all digital output bits of the differential subrange ADC.

18. The differential subrange ADC image sensing system of claim 13, wherein the first and second ramp buffers and each top and bottom bit buffers are source followers.

19. The differential subrange ADC image sensing system of claim 13, wherein the first and second ramp buffers and each top and bottom bit buffers are operational amplifiers with unity gain.

20. The differential subrange ADC image sensing system of claim 13, wherein a capacitance of the first ramp capacitor equals a capacitance of a top bit capacitor of a first top M buffered bit capacitor finger of the top M buttered bit capacitor fingers, wherein a capacitance of the second ramp capacitor equals a capacitance of the bottom bit capacitor of a first bottom M buffered bit capacitor finger of the bottom M buffered bit capacitors fingers, and wherein the capacitance of the second ramp capacitor equals the capacitance of the first ramp capacitor.

21. The differential subrange ADC image sensing system of claim 13, wherein a capacitance of the first sample capacitor is twice as much as a capacitance of a top bit capacitor of a M-th buttered bit capacitor finger of the top M buffered bit capacitor fingers, wherein a capacitance of the second sample capacitor is twice as much as a capacitance of the bottom bit capacitor of a M-th buffered bit capacitor finger of the bottom M buffered bit capacitor fingers, and wherein the capacitance of the second sample capacitor equals the capacitance of the first sample capacitor.

22. The differential subrange ADC image sensing system of claim 13, wherein a capacitance of a top bit capacitor of a second buffered bit capacitor finger of the top M buffered bit capacitor fingers is twice as much as a capacitance of the top bit capacitor of a first buffered bit capacitor finger of the top M buffered bit capacitor fingers, wherein a capacitance of a top bit capacitor of a third buffered bit capacitor finger of the the top M buffered bit capacitor fingers is twice as much as a capacitance of the top bit capacitor of the second buffered bit capacitor finger of the top M buffered bit capacitor fingers, wherein a capacitance of a bottom bit capacitor of a second buffered bit capacitor finger of the bottom M buffered bit capacitor fingers is twice as much as a capacitance of a bottom bit capacitor of the first buffered bit capacitor finger of the bottom M buffered bit capacitor fingers, and wherein a capacitance of a bottom bit capacitor of a third buffered bit capacitor finger of the bottom M buffered bit capacitor fingers is twice as much as a capacitance of the bottom bit capacitor of the second buffered bit capacitor finger of the bottom M buffered bit capacitor fingers.

23. The differential subrange ADC image sensing system of claim 13, wherein a capacitance of the top bit capacitor of an i-th buffered bit capacitor finger of the top M buffered bit capacitor fingers is twice as much as a capacitance of the top bit capacitor of an (i-1)-th buffered bit capacitor finger of the top M buffered bit capacitor fingers, wherein i is an integer equal or larger than 0 and equal or less than M-1, and wherein a capacitance of the bottom bit capacitor of an i-th buffered bit capacitor finger of the bottom M buffered bit capacitor fingers is twice as much as a capacitance of the bottom bit capacitor of an (i-1)-th buffered bit capacitor finger of the bottom M buffered bit capacitor fingers.

24. The differential subrange ADC image sensing system of claim 13, wherein a value of a least significant bit of the M UOB, determines whether a first terminal of a top bit switch of a first buffered bit capacitor finger of the top M buffered bit capacitor fingers is coupled to the second terminal of the top bit switch of the first buffered bit capacitor finger of the top M buffered bit capacitor fingers or the first terminal of the top bit switch of the first buffered bit capacitor finger of the top M buffered bit capacitor fingers is coupled to the third terminal of the top bit switch of the first buffered bit capacitor finger of the top M buffered bit capacitor fingers.

25. The differential subrange ADC image sensing system of claim 13, wherein the first ramp generator always ramps in one direction, and wherein the second ramp generator always ramps in an opposite direction of the first ramp generator.

26. A method of operating a differential subrange ADC, comprising:
   initializing a successive approximation register (SAR) ADC operation of the differential subrange ADC by setting an index number i to 1, wherein i is an integer of 1 to M, M is an integer, and wherein M is a number of upper output bits (UOB) of the differential subrange ADC;
   setting a 0th bit of top switch control signals and 1st through (M-1)th bits of the top switch control signals to supply a 0th top buffered bit capacitor finger with a low reference voltage and supply 1st through (M-1)th top buffered bit capacitor fingers with a high reference voltage, and at the same time setting all M bottom switch control signals to supply all M bottom buffered bit capacitor fingers with the high reference voltage;
   providing a first signal input voltage to a non-inverting terminal of a comparator through a first sample capacitor;
   providing a second signal input voltage to an inverting terminal of the comparator through a second sample capacitor;
   determining through an output value of the comparator whether a voltage of the non-inverting terminal of the comparator is larger than a voltage of the inverting terminal of the comparator; and
   if the voltage of the non-inverting terminal of the comparator is larger than the voltage of the inverting terminal of the comparator, for i less than M, setting a (M-i)th bit of the of the UOB of the differential subrange ADC to 1 which switches a supply of a (M-i)th top buffered bit capacitor finger from the high reference voltage to the low reference voltage which induces a voltage reduction to the non-inverting terminal of the comparator through the (M-i)th top buffered bit capacitor finger by an amount of the high reference voltage divided by 2 to the power of i, meanwhile maintains a supply of a (M-i)th bottom buffered bit capacitor finger to the high reference voltage which maintains the voltage of the inverting terminal of the comparator unchanged, otherwise, for i less than M, setting the (M-i)th bit of the of the UOB of the differential subrange ADC to 0 which maintains a supply of the (M-i)th top buffered bit capacitor finger to the high reference voltage which maintains the voltage of the non-inverting terminal of the comparator unchanged and switches a supply of a (M-i)th bottom buffered bit capacitor finger from the high reference voltage to the low reference voltage which induces a voltage reduction to the inverting terminal of the comparator through the (M-i)th bottom buffered bit capacitor finger by the amount of the high reference voltage divided by 2 to the power of i.

27. The method of operating a differential subrange ADC of claim 26, further comprising:
   determining whether i equals M; and
   if i does not equal M, continuing SAR ADC operation by incrementing the value of i by 1 and repeating the comparison between the voltage of the non-inverting terminal of the comparator and the voltage of the inverting terminal of the comparator of claim 26.

28. The method of operating a differential subrange ADC of claim 27, further comprising:
   if i equals M and a 0th bit of the of the UOB of the differential subrange ADC equals 1, maintaining the 0th top buffered bit capacitor finger to be coupled to the initially set low reference voltage which maintains the voltage of the non-inverting terminal of the comparator unchanged, and maintaining the 0th bottom buffered bit capacitor finger to be coupled to the initially set high reference voltage which maintains the voltage of the inverting terminal of the comparator unchanged; and
   if i equals M and a 0th bit of the of the UOB of the differential subrange ADC equals 0, switching the 0th top buffered bit capacitor finger to be coupled from the initially set low reference voltage to the high reference voltage which induces a voltage increment to the non-inverting terminal of the comparator through the 0th top buffered bit capacitor finger by an amount of the high reference voltage divided by 2 to the power of M, switching the 0th bottom buffered bit capacitor finger to be coupled from the high reference voltage to the low reference voltage which induces a voltage decrement to the inverting terminal of the comparator through the 0th bottom buffered bit capacitor finger by an amount of the high reference voltage divided by 2 to the power of M.

29. The method of operating a differential subrange ADC of claim 28, further comprising:

initializing a ramp ADC operation of the differential subrange ADC by providing a first ramp signal through a first ramp capacitor to the non-inverting terminal of the comparator and providing a second ramp signal through a second ramp capacitor to the inverting terminal of the comparator;

ramping a first ramp signal in a first direction and ramping a second ramp signal in a second direction simultaneously, linearly, and continuously until the output of the comparator flips its value to indicate the voltage value at the non-inverting terminal of the comparator equals the voltage value at the inverting terminal of the comparator, wherein the second direction is opposite to the first direction;

latching N lower output bits (LOB) of a ramp counter at the moment the comparator flips its output value, wherein the combined M UOB and N LOB comprises M+N digital output bits of the differential subrange ADC; and waiting for the ramp counter to reach its full count before a new analog-to-digital conversion starts.

* * * * *